United States Patent
Yamamoto et al.

(10) Patent No.: US 9,500,721 B2
(45) Date of Patent: Nov. 22, 2016

(54) MAGNETIC FIELD DETECTING DEVICE

(71) Applicant: AICHI STEEL CORPORATION, Tokai-shi (JP)

(72) Inventors: Michiharu Yamamoto, Tokai (JP); Hideo Arakawa, Tokai (JP); Takeshi Kawano, Tokai (JP)

(73) Assignee: AICHI STEEL CORPORATION, Tokai-shi (JP)

( * ) Notice: Subject to any disclaimer, the term of this patent is extended or adjusted under 35 U.S.C. 154(b) by 0 days.

(21) Appl. No.: 14/627,275

(22) Filed: Feb. 20, 2015

(65) Prior Publication Data

US 2015/0234017 A1 Aug. 20, 2015

(30) Foreign Application Priority Data

Feb. 20, 2014 (JP) ................................. 2014-031155

(51) Int. Cl.
*G01R 33/02* (2006.01)
*G01R 15/14* (2006.01)
*G01R 33/00* (2006.01)
*G01R 33/06* (2006.01)

(52) U.S. Cl.
CPC ............ *G01R 33/02* (2013.01); *G01R 15/14* (2013.01); *G01R 33/0029* (2013.01); *G01R 33/063* (2013.01)

(58) Field of Classification Search
CPC  G01R 33/02; G01R 33/0029; G01R 33/063; G01R 15/14
USPC ....................................................... 324/244
See application file for complete search history.

(56) References Cited

U.S. PATENT DOCUMENTS

| 6,239,594 B1 * | 5/2001 | Naito | ..................... G01R 33/02 324/249 |
| 2009/0212771 A1 * | 8/2009 | Cummings | .......... G01R 15/205 324/252 |

FOREIGN PATENT DOCUMENTS

| JP | 2000-338207 A | 12/2000 |
| JP | 2000338207 A | * 12/2000 |
| JP | 2002-71770 A | 3/2002 |
| JP | 2002286821 A | * 10/2002 |
| JP | 2004-045246 | 2/2004 |
| JP | 2008-011057 | 1/2008 |

OTHER PUBLICATIONS

Notification of Reasons for Refusal issued Apr. 14, 2015 in Japanese Patent Application No. 2014-031155 (with English language translation).

* cited by examiner

*Primary Examiner* — Billy Lactaoen
(74) *Attorney, Agent, or Firm* — Oblon, McClelland, Maier & Neustadt, L.L.P.

(57) ABSTRACT

A magnetic field detecting device which comprises a magnetic impedance sensor including a magnetic impedance element 1 in which a detecting coil 11 wound around an amorphous wire 10 for detecting and outputting the external magnetic field around the amorphous wire at a rise time and a fall time of the pulse current in case of the pulse current is applied to the amorphous wire and a signal processing device 3 includes two sample-hold circuit 31, 32 for respectively sample-holding the alternate current damped oscillation voltage at the rise time and the fall time of the applied pulse current, wherein the output signal in response to the external magnetic field around the amorphous wire is output based on the detected two alternate current damped oscillation voltages output at the rise time and the fall time of the pulse current.

7 Claims, 10 Drawing Sheets

(a)

(b)

MAGNETIC FIELD DETECTING DEVICE

TECHNICAL FIELD OF THE INVENTION

The present invention relates to a magnetic field detecting device suitable to measure strengths of a direct current and an alternate current magnetic field.

PRIOR ART

A conventional magnetic impedance sensor is capable of performing highly-sensitive magnetic detection, and hence is used as a sensor for a magnetic detecting device for detecting geomagnetism et al., on precise magnetic measurement and detecting for slight magnetic variation in the field of physics and chemistry and industrial field.

In recent years, on a need for a precise accurate magnetic measurement and measurement for slight magnetic field for earth magnetism and so on such as earthquake anticipating or the like, a higher sensitivity and accuracy have come to be requested to the magnetic impedance sensors.

In order to realize a magnetic field detecting device having higher accuracy than that of a conventional magnetic field detecting device, it is necessary for improving stability of zero point serving as the base of actions and for improving detection sensitivity for a semiconductor noise that an electronic circuit for signal processing basically has.

A conventional magnetic impedance sensor includes a signal processing device for detecting a magnetic field based on the magnitude of an alternate current damped oscillation voltage output at a rise or a fall of a pulse current applied to a magnetic impedance element having an amorphous wire as a magnetism-sensitive material and for signal processing {see Patent Literature 1 (WO 2005-8268) and Patent Literature 2 (WO 2010-97932)}.

SUMMARY OF THE INVENTION

In the above mentioned conventional magnetic impedance sensor, when the pulse current is applied to the amorphous wire of the magnetic impedance element as shown in FIG. 1, the alternate current damped oscillation voltage in response to a magnetic field around a place where the amorphous wire is placed is output to an output terminal of the amorphous wire. This output emerges at a rise time and a fall time of the applied pulse current as shown in FIG. 2.

For example, in a case of placing the amorphous wire in a magnetic field of a certain direction, when a pulse current is applied to this amorphous wire, an alternate current damped oscillation voltage Vr is output in the positive pole direction in response to strength of the magnetic field at the rise time of the pulse current and an alternate current damped oscillation voltage −Vf is output in the negative pole direction at the fall time as shown in FIG. 2. At this time, the magnetic impedance sensor according to the conventional art detects the magnetic field by signal processing based on the alternate current damped oscillation voltage Vr or −Vf at a rise or a fall of the pulse current. However, in comparison to a case of signal processing based on both the Alternate current damped oscillation voltages Vr and −Vf at the rise and fall times of the pulse current, processed information (signal voltage) is lost by almost half. Thus, only part of the successfully obtained output is utilized and as a result, the sensitivity of the magnetic field detection is low.

After applying such an excessive magnetic field that magnetic saturation occurs to the amorphous wire of the magnetic impedance element, even when the magnetic field is returned to zero, due to a hysteresis phenomenon, an offset voltage is generated in the output as a hysteresis component and hence the zero point is made to vary. Thus, there is a fear that the phenomenon called zero point instability is generated.

For example, when the pulse current as shown in FIG. 2(a) is applied to the amorphous wire in a certain magnetic field atmosphere, and in a case where there is no magnetic hysteresis in the amorphous wire to which the pulse current is applied, the magnetic impedance element outputs the damped oscillation Vr at the rise time of the pulse current in response to the magnetic field around and outputs the damped oscillation −Vf at the fall time of the pulse current as shown in FIG. 2(b). Basically, the alternate current damped oscillation voltage Vr at the rise time of the applied pulse current and the damped oscillation Vf at the fall time of the pulse current fall into a relationship as in the following mathematical formula 1.

$$|Vr| \approx |-Vf| \quad \text{[Formula 1]}$$

However, after applying such an excessive magnetic field that magnetic saturation occurs in a certain pole direction to the amorphous wire, a hysteresis component Vh thereof is generated. Thus, for example, the damped oscillation output at the rise time of the pulse current may be Vr−Vh and the output at the fall time of the pulse current may be −Vf−Vh as shown in FIG. 2(c).

The alternate current damped oscillation output Vr at the rise time of the applied pulse current and the damped oscillation output −Vf at the fall time of the pulse current fall into a relationship as in the following mathematical formula 2.

$$|Vr-Vh| \neq |-Vf-Vh| \quad \text{[Formula 2]}$$

Therefore, an absolute value of the output of the magnetic impedance element at the rise time of the pulse current is not equal to the output at the fall time of the pulse current.

After applying an excessive magnetic field in the polar direction opposite to the above description, as a result of hysteresis, the output at the rise time is Vr+Vh and the output at the fall time is −Vf+Vh as shown in FIG. 2(d).

The alternate current damped oscillation voltage Vr at the rise time of the pulse current and the damped oscillation −Vf at the fall time of the pulse current fall into a relationship as in the following mathematical formula 3.

$$|Vr+Vh| \neq |-Vf+Vh| \quad \text{[Formula 3]}$$

Thus, an absolute value of the output of the magnetic impedance element at the rise time of the pulse current is not equal to the output at the fall time of the pulse current.

The conventional magnetic impedance sensor signal processes based on the alternate current damped oscillation voltage output at the rise time or the fall time of the pulse current, and outputs as a magnetic signal around the amorphous wire.

That is, the information of part of the outputs of the magnetic impedance element is only utilized, and there is a slight fear that an error will be mixed attributed to an offset of the absolute value |Vh| of the hysteresis component as described above, and no trail as to countermeasures to resolve this was known.

That is, elimination of this offset error of the hysteresis component restrainer the effect by the hysteresis phenomenon. This improves the stability of zero point and becomes a key to realizing a magnetic field detecting device having higher accuracy.

Improvement of the ratio relative to a noise of an electronic circuit of the signal processing device constituting the magnetic impedance sensor by devising to obtain the outputs of the magnetic impedance element as voltages of larger magnitude is another key to realizing a magnetic field detecting device having high accuracy.

A magnetic impedance sensor of the present invention was conceived in order to solve the above mentioned problems, and an object thereof is to enable to provide a magnetic impedance sensor having higher accuracy by which an influence of the hysteresis component, that is, the error component of |Vh| is restrained and the stability of zero point is improved, and by obtaining an output of a magnetic impedance element as a voltage of high magnitude and hence achieving higher sensitivity, the ratio of the magnitude of a detected magnetic signal relative to a noise of an electronic circuit is improved.

In order to solve the above mentioned problems, the inventors of the present invention focused on a first technical idea of the present invention in which signal processing is performed by utilizing outputs both at a rise time and a fall time of alternate current damped oscillation voltages output both at the rise time and the fall time of a pulse current in a case where the pulse current is applied to an amorphous wire, and an output signal in response to the external magnetic field is output based on the two alternate current damped oscillation voltages. Further, as a result of much research and development, the inventors reached the present invention in which by obtaining the output of the magnetic impedance element as a voltage of larger magnitude, the ratio of the magnitude of the detected signal relative to a noise of an electronic circuit of a signal processing device constituting the magnetic impedance sensor is improved.

In addition, the inventors of the present invention focused on a second technical idea of the present invention in which an external magnetic field operating means provided in the signal processing device operates the external magnetic field around the amorphous wire by obtaining a sum of absolute values of the two alternate current damped oscillation voltages output at the rise time and the fall time of the applied pulse current, and reached the present invention to achieve the object of improving the ratio of the output of the magnetic impedance element relative to the noise of the electronic circuit of the signal processing device and realizing a magnetic field detecting device having higher sensitivity.

Further, the inventors of the present invention focused on a third technical idea of the present invention in which a hysteresis component cancel means provided in the signal processing device cancels hysteresis components generated after the magnetic field included in the two alternate current damped oscillation voltages which are output at the rise time and the fall time of the applied pulse current is applied, and reached the present invention to achieve the object of improving the stability of zero point by eliminating the offset error and realizing a magnetic field detecting device having higher accuracy.

A magnetic field detecting device on a first aspect of the present invention which comprises a magnetic impedance element for outputting two alternate current damped oscillation voltages in response to the external magnetic field around an amorphous wire at a rise time and a fall time of a pulse current, in case of the pulse current is applied to said amorphous wire, and a signal processing device for signal processing the two alternate current damped oscillation voltages output at the rise time and the fall time of the pulse current and for outputting an output signal, wherein the output signal in response to the external magnetic field around said amorphous wire is output based on the two alternate current damped oscillation voltages output at the rise time and the fall time of the pulse current, and the signal processing device includes a hysteresis component cancel means for canceling hysteresis components included on the two alternate current damped oscillation voltages at the rise time and the fall time of the applied pulse current generated in case of the magnetic field being applied by the hysteresis of the magnetic variation passing through.

The magnetic field detecting device on a second aspect of the present invention according to the first aspect, wherein the magnetic impedance element is constructed that the two alternate current damped oscillation voltages at the rise time and the fall time of the pulse current are output between two electrodes of the amorphous wire.

The magnetic field detecting device on a third aspect of the present invention according to the first aspect, wherein the magnetic impedance element is constructed that the two alternate current damped oscillation voltages at the rise time and the fall time of the pulse current are output between two electrodes of a detecting coil wound around the amorphous wire.

The magnetic field detecting device on a fourth aspect of the present invention according to the first aspect, wherein the hysteresis component cancel means includes an external magnetic field operating means for operating the external magnetic field around the amorphous wire by obtaining a sum of absolute values of the two alternate current damped oscillation voltages including the hysteriesis components at the rise time and the fall time of the pulse current.

The magnetic field detecting device on a fifth aspect of the present invention according to the third aspect, wherein the signal processing device includes a sample hold means for sample-holding the alternate current damped oscillation voltages, and the sample hold means comprises two sample hold circuits, having a switch means connected to the magnetic impedance element and a capacitor having one grounded end, only connected to the switch means, for sample-holding respectively the two alternate current damped oscillation voltages including the hysteresis components output from the magnetic impedance element at the rise time and the fall time of the pulse current.

The magnetic field detecting device on a sixth aspect of the present invention according to the fifth aspect, wherein the hysterisis component cancel means includes an operating means for operating the difference between the two sample-held voltages of the two alternate current damped oscillation voltages including the hysteresis components output from the two sample hold circuits at the rise time and the fall time of the pulse current.

An improving method, on a seventh aspect of the present invention, for improving the accuracy on the measurement for detecting a magnetic field by a magnetic impedance element for outputting the alternate current damped oscillation voltages in response to the external magnetic field around an amorphous wire, in case of the pulse current is applied to said amorphous wire, two alternate current damped oscillation voltages are signal processed after applying the excess magnetic field to the amorphous wire of the magnetic impedance element, and a hysteresis component generated in case of applying the excess magnetic field is cancelled by obtaining a sum of absolute values of the two alternate current damped oscillation voltages at the rise time and the fall time of the pulse current or the difference between the two voltages obtained by signal-processing two alternate current damped oscillation voltages.

On the magnetic field detecting device of the first aspect of the present invention having the construction described above, which comprises the magnetic impedance element for outputting two alternate current damped oscillation voltages in response to the external magnetic field around the amorphous wire at the rise time and the fall time of the pulse current, in case of the pulse current is applied to the amorphous wire, and the signal processing device for signal processing the two alternate current damped oscillation voltages output at the rise time and the fall time of the pulse current and for outputting the output signal, wherein the output signal in response to the external magnetic field around the amorphous wire is output based on the two alternate current damped oscillation voltages output at the rise time and the fall time of the pulse current. Therefore, the ratio relative to the noise in the electronic circuit of the signal processing device constituting the magnetic impedance sensor can be improved by obtaining the output of the magnetic impedance element as a voltage of larger magnitude than that of the conventional art and an effect of realizing a magnetic field detecting device having high accuracy is attained.

Furthermore in the first aspect of the present invention the hysteresis component cancel means included in the signal-processing device cancels the hysteresis component induced on the two alternate current damped oscillation voltages at the rise time and the fall time of the pulse current generated in case of being applied the magnetic field, by the hysteresis of the magnetic variation passing through and an effects of eliminating the offset error, improving the stability of zero point and realizing the magnetic field detection having high accuracy are attained.

On the magnetic field detecting device of the second aspect of the present invention having the construction described above, according to the first aspect, the ratio relative to the noise in the electronic circuit of the signal processing device constituting the magnetic impedance sensor is improved by obtaining the output of the magnetic impedance element as a voltage of larger magnitude by the signal processing device outputting the output signal in response to the external magnetic field around the amorphous wire based on the alternate current damped oscillation voltages both at the rise time and the fall time of the pulse current output between two electrodes of the amorphous wire by the magnetic impedance element, an effect of realizing a magnetic field detecting device having high accuracy is attained, and the stability of zero point is improved by eliminating the offset error and the magnetic field detecting device having higher accuracy is realized.

On the magnetic field detecting device of the third aspect of the present invention having the construction described above, according to the first aspect of the present invention, the magnetic impedance element applies the both alternate current damped oscillation voltages at the rise time and the fall time of the pulse current output between two electrodes of a detecting coil wound around the amorphous wire. Therefore the same effect of the magnetic field detecting device of the second aspect of the present invention is obtained. And the alternate current damped oscillation voltages output by the detecting coil are generally higher than the alternate current damped oscillation voltages output between the two electrodes of the amorphous wire. Thus, the output can be obtained as a voltage of larger magnitude than that in the second aspect of the present invention and a magnetic field detecting device having higher accuracy is realized.

On the magnetic field detecting device of the fourth aspect of the present invention having the construction described above, according to the first aspect of the present invention, the external magnetic field operating means included on the hysteresis component cancel means operates the external magnetic field around the amorphous wire by obtaining a sum of absolute values of the two alternate current damped oscillation voltages including the hysteresis components at the rise time and the fall time of the pulse current.

Therefore, an information amount (signal voltage), which is almost twice more than that of the magnetic impedance sensor according to the conventional art, can be obtained. Thus, the ratio of the output of the magnetic impedance element relative to the noise of the electronic circuit of the signal processing device is improved by canceling the hysteresis components included in the current damped oscillation voltages and a more sensitive magnetic field detecting device is realized.

On the magnetic field detecting device of the fifth aspect of the present invention having the construction described above, according to the first aspect of the present invention, the signal processing device includes the sample hold means for sample-holding the alternate current damped oscillation voltages, and two sample hold circuits comprising the sample hold means, having a switch means connected to the magnetic impedance element and a capacitor having one grounded end, only connected to the switch means, sample-hold respectively the two alternate current damped oscillation voltages including the hysteresis components output from the magnetic impedance element at the rise time and the fall time of the pulse current. Thus, the offset error can be eliminated by making it possible to sample hold the alternate current damped oscillation voltages including the hysteresis components and by canceling the hysteresis components included in the current damped oscillation voltages, so that the stability of zero point is improved and an effect of realizing a magnetic field detecting device having higher accuracy is attained. So, this offset error of the hysteresis component can be eliminated. This improves the stability of zero point and attains the effect of realizing a magnetic field detecting device having higher accuracy.

On the magnetic field detecting device of the sixth aspect of the present invention having the construction described above, according to the fifth aspect of the present invention, the operating means included on the hysterisis component cancel means operates the difference between the two sample-held voltages of the two alternate current damped oscillation voltages output from the two sample hold circuits at the rise time and the fall time of the pulse current. Therefore the differential operating device realizes the magnetic field detection with high sensitivity, and even in a case of applying such an excessive magnetic field that magnetic saturation occurs, hysteresis components generated due to the excessive magnetic field are canceled out and removed by making it possible to sample hold the alternate current damped oscillation voltages including the hysteresis components. As a result, an offset error can be eliminated, the stability of zero point is improved, the magnetic field detection with higher accuracy is enabled, and an effect of realizing a magnetic field detecting device having such high accuracy is attained.

The improving method on the seventh aspect of the present invention for improving the accuracy on the measurement for detecting a magnetic field by a magnetic impedance element for outputting the alternate current damped oscillation voltages in response to the external magnetic field around an amorphous wire according to the present invention, in case of the pulse current is applied to the amorphous wire, two alternate current damped oscillation voltages are signal processed after applying the excess magnetic field to said amorphous wire of the magnetic impedance element, and the hysteresis component is cancelled by obtaining a sum of absolute values of the two alternate current damped oscillation voltages at the rise time and the fall time of the pulse current or the difference between the two voltages obtained by signal-processing two alternate current damped oscillation voltages. Therefore the improving method realizes the magnetic field detection with high sensitivity, and even in a case of applying such an excessive magnetic field that magnetic saturation occurs, hysteresis components generated due to the excessive magnetic field are canceled out and removed. As a result, an offset error can be eliminated, the stability of zero point is improved, the magnetic field detection with higher accuracy is enabled, and an effect of realizing a magnetic field detecting device having such high accuracy is attained.

Ways of A-D converting, sample holding and others are available to the signal-processing for the above described two alternate damped oscillation voltages.

DESCRIPTION OF THE PREFERRED EMBODIMENTS

Hereinafter, the best mode of the present invention will be described based on embodiments and examples with reference to the drawings.

First Embodiment

Figure 3:
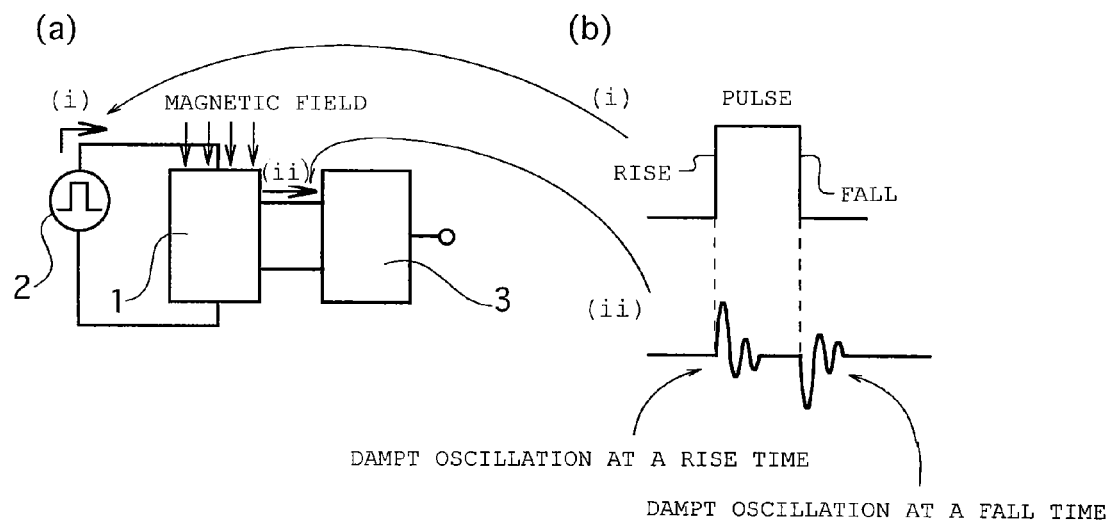
FIG. 3 is a block circuit diagram showing a main part of a magnetic field detecting device of a first embodiment of the present invention, and a diagram showing an applied pulse current of an amorphous wire and an output waveform.

A magnetic field detecting device of a first embodiment is constructed in such a manner that as shown in FIG. 3(*a*), a pulse current is applied to an amorphous wire of a magnetic impedance element 1 by a pulse oscillation circuit 2, and based on two alternate current (AC) damped oscillation voltages output at a rise time and a fall time of the pulse current from the magnetic impedance element, a signal processing device 3 outputs as an external magnetic field signal around the amorphous wire.

In addition, "outputting the output signal in response to the external magnetic field around the amorphous wire based on the alternate current damped oscillation voltages or waveforms of the voltages" indicates that signal processing is performed depending on peak values, instantaneous values, average values, effective values of the two alternate current damped oscillation voltages output at the rise time and the fall time of the pulse current from the magnetic impedance element, or absolute values of the above values, and a peak-to-peak value between the peak value of the alternate current damped oscillation voltage at the rise time of the pulse current and the peak value of the alternate current damped oscillation voltage at the fall time, and the like. Thereby, in comparison to a case where the output voltage at any one of the rise time and the fall time is utilized as in the conventional example, an output of higher magnitude can be obtained, so that a magnetic field detecting device having high sensitivity can be constructed.

In the magnetic field detecting device of the first embodiment, the pulse current shown in FIG. 3(*b*)(*i*) is applied to the amorphous wire of the magnetic impedance element 1 by the pulse oscillation circuit 2, and based on the two alternate current damped oscillation voltages output at the rise time and the fall time of the pulse current from the magnetic impedance element and shown in FIG. 3(*b*)(*ii*), the signal processing device 3 outputs as the external magnetic field signal around the amorphous wire. Therefore in the magnetic field detecting device of the first embodiment the magnetic field information output by the magnetic impedance element 1 is utilized without loss, an output of high magnitude can be obtained as described above, and an effect of realizing a magnetic field detecting device as a magnetic impedance sensor having high sensitivity and high accuracy is attained.

Second Embodiment

Figure 4:
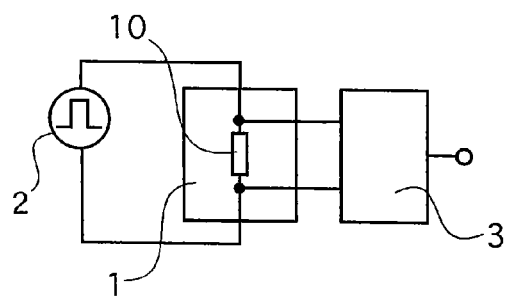
FIG. 4 is a block circuit diagram showing a main part of a magnetic field detecting device of a second embodiment of the present invention.

A magnetic field detecting device of a second embodiment is constructed in such a manner that as shown in FIG. 4, since the pulse current is applied to the magnetic impedance element 1 by the pulse oscillation circuit 2, the alternate current damped oscillation voltages at the rise time and the fall time of the pulse current are output between two electrodes of an amorphous wire 10 constituting the magnetic impedance element 1, and the signal processing device 3 processes signals of the output alternate current damped oscillation voltages and outputs as the external magnetic field signal around the amorphous wire.

In the magnetic field detecting device of the second embodiment, based on the two alternate current damped oscillation voltages output at the rise time and the fall time of the pulse current from the part between the two electrodes of the amorphous wire 10 constituting the magnetic impedance element 1, the signal processing device 3 outputs as the external magnetic field signal around the amorphous wire. Thus, the magnetic field information output by the magnetic impedance element is utilized without loss. Therefore, in the second embodiment for the reason described above, magnetic field detection with high sensitivity and high accuracy is enabled, and an effect of realizing a magnetic field detecting device as a magnetic impedance sensor having high sensitivity and high accuracy is attained.

Third Embodiment

Figure 5:
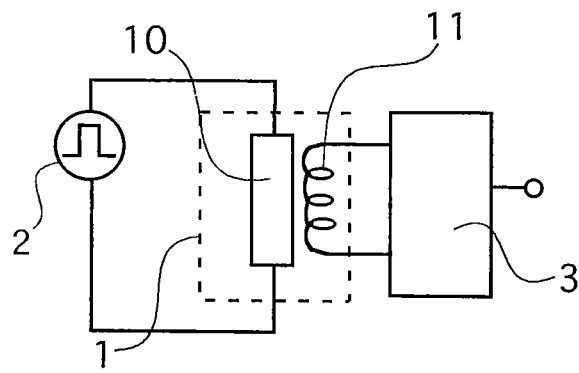
FIG. 5 is a block circuit diagram showing a main part of a magnetic field detecting device of a third embodiment of the present invention.

A magnetic field detecting device of a third embodiment is constructed in such a manner that as shown in FIG. 5, the alternate current damped oscillation voltages at the rise time and the fall time of the pulse current are output between two electrodes of a detecting coil 11 wound around the amorphous wire 10 constituting the magnetic impedance element 1, and based on the two alternate current damped oscillation voltages output at the rise time and the fall time of the pulse current from the detecting coil, the signal processing device 3 outputs as a magnetic field signal around the amorphous wire 10.

In the magnetic field detecting device of the third embodiment, based on the two alternate current damped oscillation voltages output at the rise time and the fall time of the pulse current between the two electrodes of the detecting coil 11 which is wound around the amorphous wire 10, the signal processing device 3 outputs as the magnetic field signal around the amorphous wire 10. Thus, the output information of the magnetic impedance element is utilized without loss. Therefore, in the third embodiment for the reason described above, the magnetic field detection with higher sensitivity and higher accuracy than those of the above second embodiment is enabled, and an effect of realizing a magnetic field detecting device as a magnetic impedance sensor having high sensitivity and high accuracy is attained.

Fourth Embodiment

Figure 6:
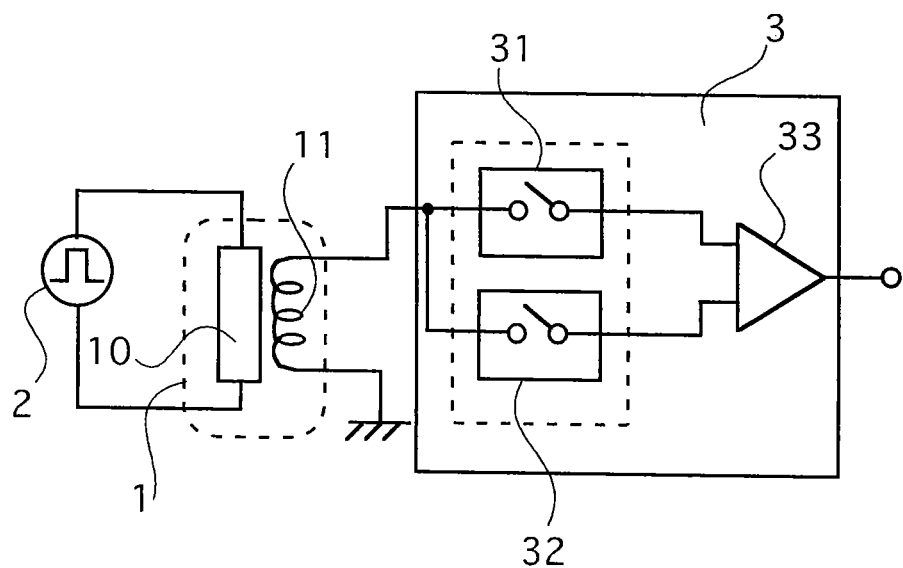
FIG. 6 is a block circuit diagram showing a main part of a magnetic field detecting device of a fourth embodiment of the present invention.

A magnetic field detecting device of a fourth embodiment is constructed in such a manner that as shown in FIG. 6, according to the third embodiment, the signal processing device 3 includes two sample-hold circuits 31, 32 for respectively sample-holding the alternate current damped oscillation voltages at the rise time and the fall time of the pulse current output by the detecting coil 11 of the magnetic impedance element 1, and a differential operating device 33 as an external magnetic field operating means for operating a difference between the two sample-held voltages and a hysteresis component cancel means.

In the magnetic field detecting device of the fourth embodiment, by obtaining a sum of the two alternate current damped oscillation voltages output at the rise time and the fall time of the pulse current by the two sample-hold circuits 31, 32 respectively sample-holding the alternate current damped oscillation voltages at the rise time and the fall time of the pulse current output by the detecting coil 11 of the magnetic impedance element 1 and by the differential operating device 33 operating the difference between the two sample-held voltages in the signal processing device 3, the ratio of the output of the magnetic impedance element relative to a noise of an electronic circuit of the signal processing device is improved and the magnetic field detection with high sensitivity is realized, and even in a case of applying such an excessive magnetic field that magnetic saturation occurs, hysteresis components generated due to the excessive magnetic field and included in the two alternate current damped oscillation voltages output from the detecting coil 11 at the rise time and the fall time of the pulse current are canceled out and removed. As a result, in the fourth embodiment an offset error can be eliminated, the stability of zero point is improved, the magnetic field detection with higher accuracy is enabled, and an effect of realizing a magnetic field detecting device having such high accuracy is attained.

First Example

Figure 7:
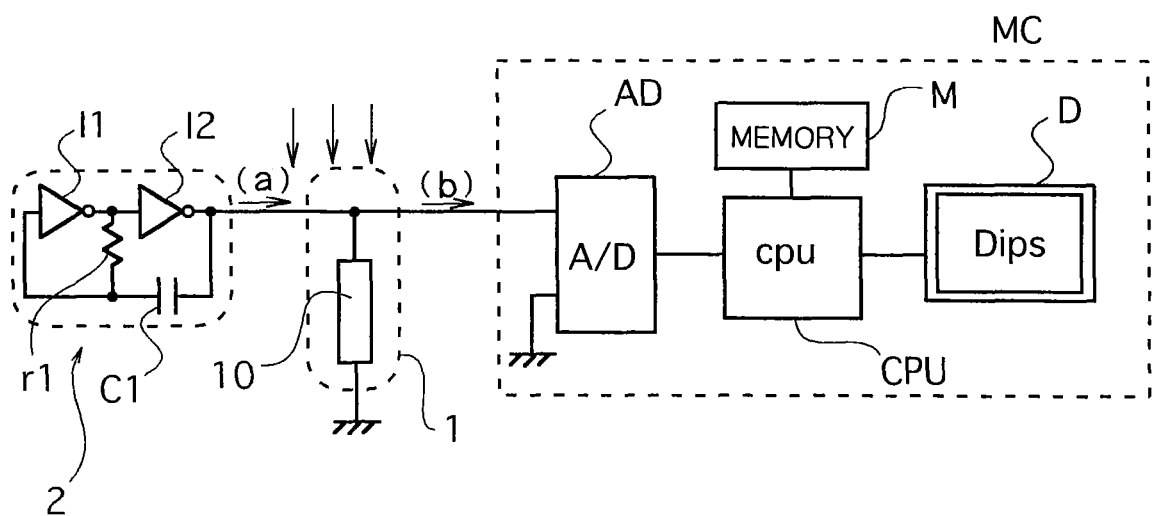
FIG. 7 is a detailed circuit diagram showing the details of a magnetic field detecting device of a first example of the present invention.

A magnetic field detecting device of a first example is based on the first embodiment and the second embodiment, in which operating processing is performed with use of a microcomputer as the signal processing device as shown in FIG. 7. By displaying a magnetic variation in time series, a magnetic field detecting device having high sensitivity and high accuracy is realized.

Figure 8:
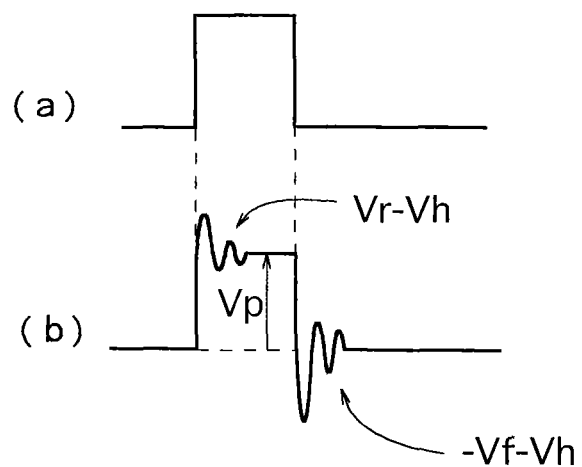
FIG. 8 is a diagram showing an applied pulse current of an amorphous wire in the first example and an output waveform.

The magnetic impedance element 1 comprises an amorphous wire 10 arranged in the external magnetic field to be detected as shown in FIG. 7, one end of which is connected to the ground, and when the pulse current as shown in FIG. 8(*a*) is applied to the other end of the amorphous wire 10 by the pulse oscillation circuit 2 to be described later, output signals including the two alternate current damped oscillation voltages output at the rise time and the fall time of the pulse current are output from an output terminal of the other end on the amorphous wire 10 as shown in FIG. 8(*b*).

As shown in FIG. 7, the pulse oscillation circuit 2 is constituted a multivibrator comprising a logic IC in which logic circuits I1 and I2, a resistor r1 connected to an input and an output terminals of the logic circuit I1 of the logic IC, and a capacitor C1 an input terminal of which is connected to the input terminal of the logic circuit I1 of the logic IC and to the output terminal of the logic circuit I2, and the output terminal of the logic circuit I2 is connected to the other end serving as an output terminal of the amorphous wire 10, and the pulse current shown in FIG. 8(*a*) is output on a predetermined period.

The signal processing device 3 comprises a microcomputer MC including an A/D converter AD in which one of input terminals is connected to the other end serving as the output terminal of the amorphous wire 10 and the other input terminal is grounded, a central processing unit CPU, connected to an output terminal of the A/D converter AD, for operating as described later with use of the output signals in which the two alternate current damped oscillation voltages output at the rise time and the fall time of the applied pulse current are included, a memory M connected to the central processing unit CPU, and a display D connected to the central processing unit CPU serving as a display device for displaying the magnetic variation in time series.

In the memory M of the microcomputer MC, a program for operating and signal-processing the output signals in which the two alternate current damped oscillation voltages output at the rise time and the fall time of the applied pulse current are included as described later is stored, and the output voltages of the magnetic impedance element are converted into digital quantities by the A/D converter AD and stored in the memory M.

Figure 9:
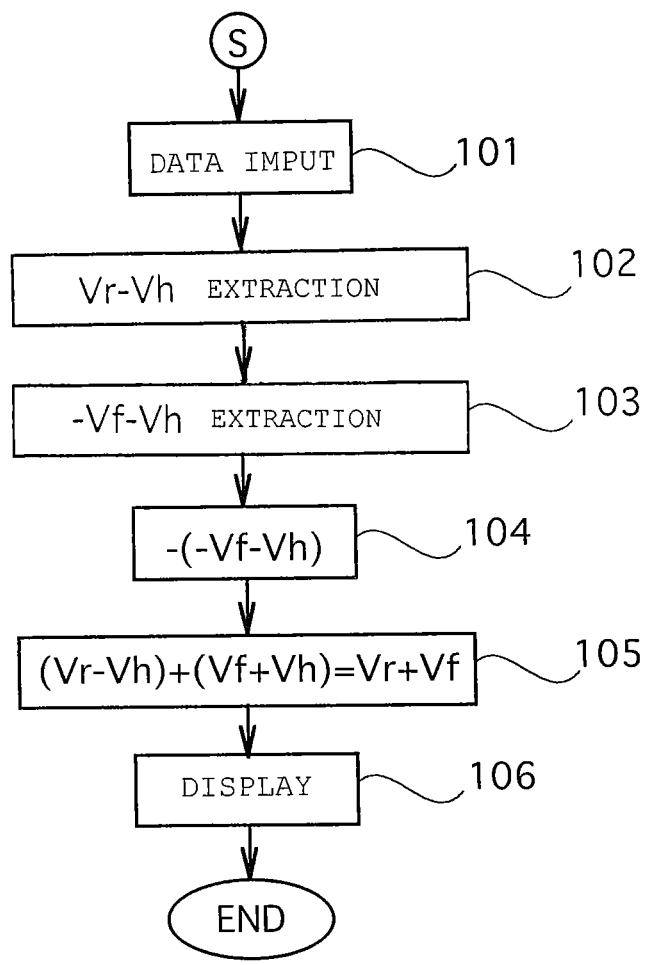
FIG. 9 is a flowchart showing a control flow serving as the basis of signal processing in a microcomputer MC in the first example.

That is, the signal processing in the microcomputer MC is performed in accordance with a flowchart shown in FIG. 9.

Once the processing is started, first in Step 101, the output signals of the magnetic impedance element 1 including the two alternate current damped oscillation voltages output at the rise time and the fall time of the applied pulse current are input and stored in the memory M as data.

In Step 102, an alternate current damped oscillation voltage Vr−Vh at the rise time is extracted by a method to be described later, in Step 103, an alternate current damped oscillation voltage −Vf−Vh at the fall time is extracted, and in Step 104, the minus sign is given to the alternate current damped oscillation voltage −Vf−Vh at the fall time, so that Vf+Vh is obtained.

Next, in Step 105, the data of the alternate current damped oscillation voltage Vr−Vh at the rise time and the alternate current damped oscillation voltage Vf+Vh at the fall time whose sign is reversed and are added to each other, the hysteresis component −Vh and the hysteresis component+ Vh are canceled out, and Vr+Vf is obtained, and in Step 106, Vr+Vf after the cancellation of Vh is displayed on the display D, and the processing is ended.

In the magnetic field detecting device of the first example with the above construction, when the pulse current shown in FIG. 8(a) is applied to the amorphous wire 10 by the pulse oscillation circuit 2, the alternate current damped oscillation voltage Vr−Vh at the rise time and the alternate current damped oscillation voltage −Vf−Vh at the fall time in response to the magnetic field around the amorphous wire shown in FIG. 8(b) are generated between the two electrodes of the amorphous wire 10.

A pulse voltage Vp added to the amorphous wire 10 by the pulse oscillation circuit 2 is superimposed on the alternate current damped oscillation voltage Vr−Vh at the rise time. Here, −Vh indicates the above described hysteresis component.

The signal processing device 3 comprising the microcomputer MC converts the output voltages of the magnetic impedance element including the alternate current damped oscillation voltage Vr−Vh+Vp at the rise time in which the pulse voltage Vp is superimposed, and the alternate current damped oscillation voltage −Vf−Vh at the fall time into digital quantities by the A/D converter AD, and stores in the memory M.

Next, the superimposed Vp is removed, so that the alternate current damped oscillation voltage Vr−Vh at the rise time is extracted, and since the polarity of −Vf is reversed to that of Vr (positive to negative), the minus sign is given to the alternate current damped oscillation voltage (−Vf−Vh) at the fall time, so that Vf+Vh is obtained as shown in the following mathematical formula 4.

$$-(-Vf-Vh)=Vf+Vh \quad [\text{Formula 4}]$$

Next, the alternate current damped oscillation voltage Vr−Vh at the rise time and the alternate current damped oscillation voltage Vf+Vh at the fall time whose sign is reversed are added to each other as shown in formula 5 below.

In addition, formula 5 below is equal to operation of a sum of absolute values of the alternate current damped oscillation voltage at the rise time of the pulse current and the alternate current damped oscillation voltage at the fall time of the pulse current.

$$(Vr-Vh)+(Vf+Vh)=Vr+Vf \quad [\text{Formula 5}]$$

Vr+Vf obtained by the addition is displayed on a screen of the display D.

As described above, when the pulse oscillation circuit 2 repeatedly applies the pulse current on a predetermined period, the magnetic signals detected in time series or chronological order can be displayed on a graph as time transition.

In the magnetic field detecting device of the first example exerting the above described operations, by the microcomputer MC for realizing a function as the hysteresis component cancel means operating as described above with use of the two detected alternate current damped oscillation voltages even in a case of generating the hysteresis components which causes an accuracy decrease in a case where only one of the alternate current damped oscillation voltages is detected as in the conventional example by applying such an excessive magnetic field that magnetic saturation occurs, the hysteresis components are canceled out and removed and the offset error can be eliminated. Thus, the stability of zero point is improved, and an effect of realizing a magnetic field detecting device having higher accuracy is attained.

That is, in the magnetic field detecting device of the first example, by using the magnetic information of both the alternate current damped oscillation voltage Vr−Vh at the rise time and the alternate current damped oscillation voltage −Vf−Vh at the fall time, an influence of the absolute values |Vh| of the hysteresis components generated after applying such an excessive magnetic field that magnetic saturation occurs can be excluded. As a result, the stability of zero point can be improved, and an effect of enabling to realize a magnetic field detecting device having high accuracy in which the magnitude of the signal relative to the noise of the electronic circuit of the signal processing device (SN ratio) is improved nearly twice as much, is attained.

Figure 10:
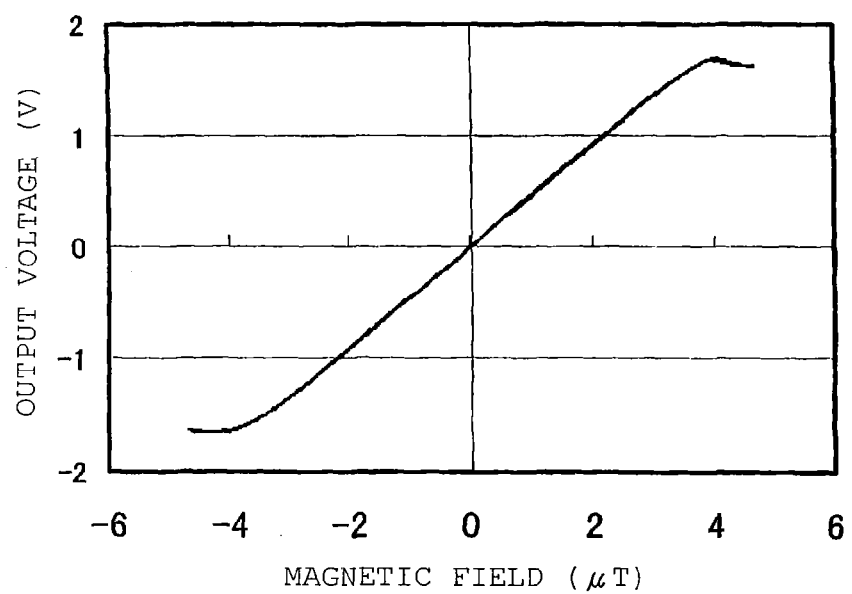
FIG. 10 is a diagram showing a relationship between a detected magnetic field and an output in the first example, and a diagram showing a relationship between a detected magnetic field and an output in the conventional magnetic impedance sensor.
Figure 10:
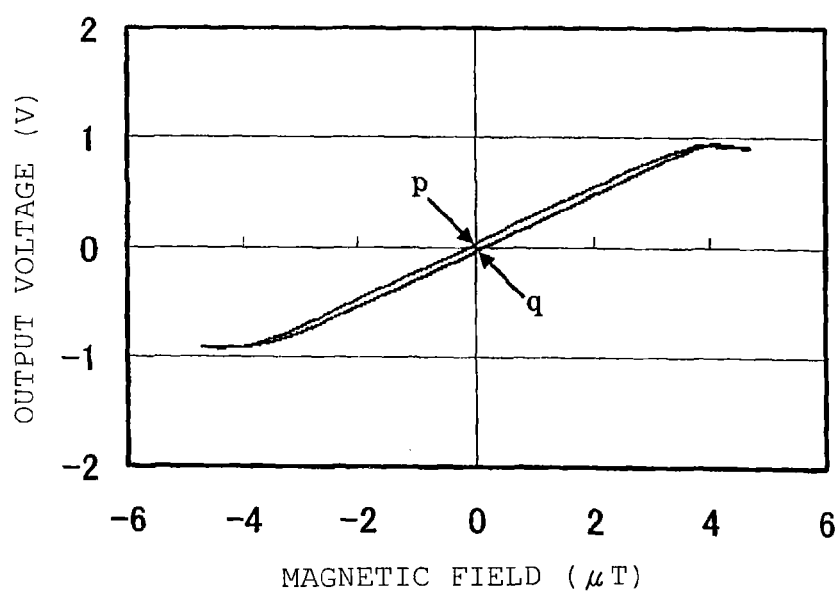

That is, as shown in FIG. 10(a), a favorable linearity characteristic was able to be obtained for the magnetic field of the region in which the output relative to the magnetic field is about ±4 µT (microtesla).

Meanwhile, in a region over the region of ±4 µT, magnetic saturation occurs in the amorphous wire 10. However, even upon returning from the saturation region, a hysteresis phenomenon is restrained and no offset is found. When the applied magnetic field becomes zero, the output becomes zero V, and the zero point is not caused to vary.

On the contrary, in the conventional magnetic field detecting device for signal processing based on the damped oscillation at any one of the rise time and the fall time, as shown in FIG. 10(b), magnetic saturation occurs in the amorphous wire in the region over the region of t 4 µT, and when returning to the region of +4 µT, by the hystereses of the magnetic variation passing through by then, the output at the zero magnetic field becomes any of two values p and q, and an instability phenomenon of zero point occurs. Thereby, the magnetic field detecting device of the first example achieved to solve the first technical problem to improve the stability of zero point.

Regarding a variation in the output voltages relative to the magnitude of the magnetic field, that is, detection sensitivity expressed by respective linear gradients or inclinations in FIGS. 10(a) and 10(b), a characteristic shown in FIG. 10(a) of the first example was about 1.8 times higher in sensitivity than a characteristic shown in FIG. 10(b) of the conventional art of signal-processing based on the damped oscillation at any one of the rise time and the fall time.

Therefore, the ratio of the detected magnetic signal relative to the semiconductor noise on the electronic circuit of the signal processing device 3 was able to be improved by 1.8 times.

Therefore, the second technical problem to increase the ratio of the magnitude of the detected magnetic signal relative to the noise of the electronic circuit of the signal processing device 3 achieved to be solved.

As described above, effectiveness of the magnetic field detecting device of the first example was able to be confirmed.

Figure 11:
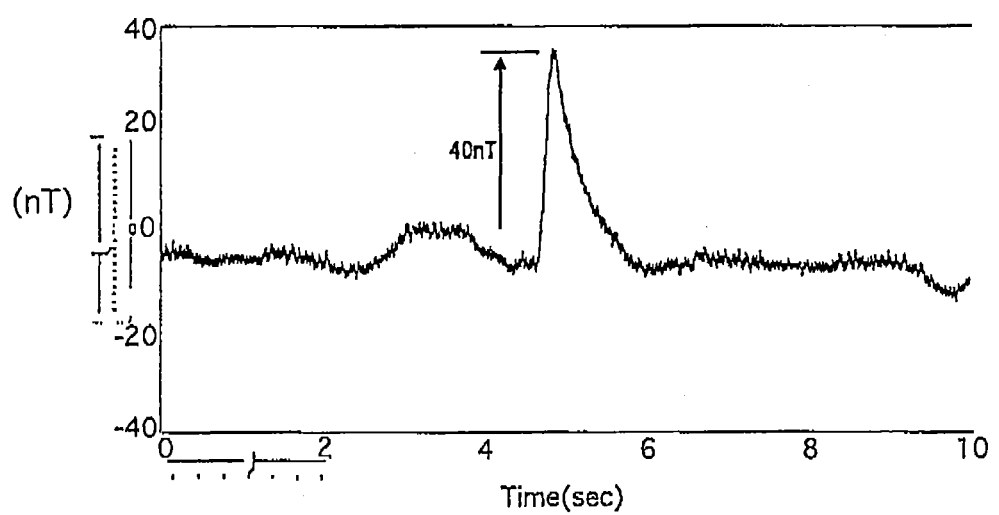
FIG. 11 is a diagram showing a measurement example in which a magnetic noise generated from an electronic device is detected in the first example.

A measurement example, in which a magnetic noise generated by an electronic device is detected by the magnetic field detecting device of the first example, is shown in FIG. 11 with the horizontal axis of time (second) and the vertical axis of the magnetic field (nT). About 40 nT (nanotesla) of the magnetic noise of the electronic device achieved to be detected.

Second Example

Figure 12:
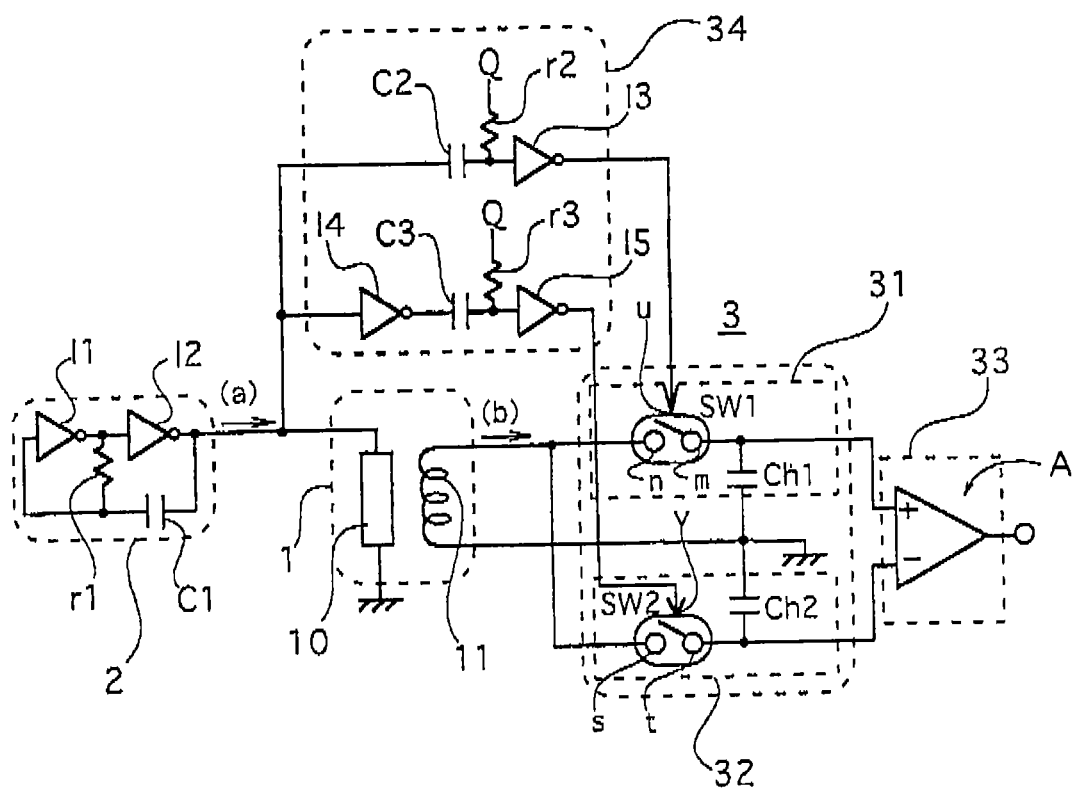
FIG. 12 is a detailed circuit diagram showing the details of a magnetic field detecting device of a second example of the present invention.

A magnetic field detecting device of a second example is based on the above described first embodiment, the third embodiment, and the fourth embodiment, in which as shown in FIG. 12, the magnetic impedance element 1 includes the detecting coil 11 wound around the amorphous wire 10, and the signal processing device 3 includes the two sample-hold circuits 31, 32 for respectively sample-holding the alternate current damped oscillation voltages at the rise time and the fall time of the pulse current applied to the amorphous wire 10, and the differential operating device 33 as the external magnetic field operating means and the hysteresis component cancel means for operating the difference between the two sample-held voltages.

Figure 13:
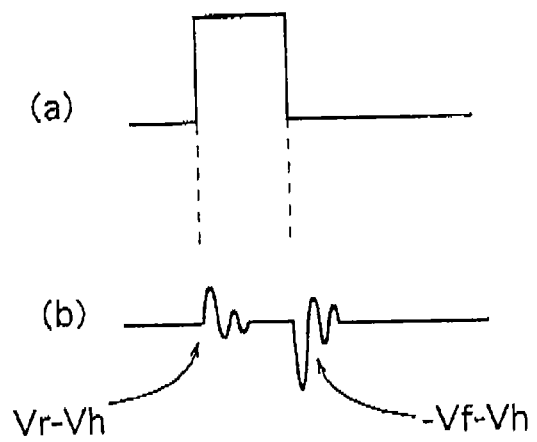
FIG. 13 is a diagram showing an applied pulse current of an amorphous wire in the second example and an output waveform.

In the above described magnetic impedance element 1 arranged in the external magnetic field to be detected as shown in FIG. 12, comprises the amorphous wire 10 in which one end is connected to the ground, and when the pulse current shown in FIG. 13(a) is applied to the output terminal of the amorphous wire 10 by the pulse oscillation circuit to be described later, the output signals, including the two alternate current damped oscillation voltages shown in FIG. 13(b) at the rise time and the fall time of the pulse current, are output from the output terminal of the detecting coil 11.

The alternate current damped oscillation voltages at the rise time and the fall time of the pulse current are output between two electrodes of the detecting coil 11 wound around the amorphous wire 10 constituting the magnetic impedance element 1, and based on the two alternate current damped oscillation voltages output with high sensitivity at the rise time and the fall time of the pulse current, the signal processing device 3 is constructed to output an output signal as the magnetic field signals around the amorphous wire 10.

As shown in FIG. 12, the pulse oscillation circuit 2 comprises the multivibrator including the logic IC which comprises the logic circuits I1 and I2, the resistor r1 connected to the input terminal of the amorphous wire 10 and the output terminal of the logic circuit I1 of the logic IC, and the capacitor C1 connected to the input terminal of the logic circuit I1 of the logic IC and the output terminal of the logic circuit I2 of the multivibrator, that is, the oscillation circuit 2 is connected to the amorphous wire 10 so as to construct to apply the pulse current of time width T to the amorphous wire 10.

The signal processing device 3 comprises the first sample-hold circuit 31 including a first analog switch SW1 having an input terminal n connected to one terminal of the detecting coil 11 whose other terminal is grounded, and a first hold capacitor Ch1 connected between an output terminal m of the first analog switch SW1 and the ground, for sample-holding the alternate current damped oscillation voltage at the rise time of the applied pulse current from the detecting coil 11 at a predetermined timing in synchronization with the pulse oscillation circuit 2, the second sample-hold circuit 32 comprising a second analog switch SW2 having an input terminal s connected to the terminal of the detecting coil 11 to which the input terminal n of the first analog switch SW1 is connected, and a second hold capacitor Ch2 connected between an output terminal t of the second analog switch SW2 and the ground, for sample-holding the alternate current damped oscillation voltage at the fall time of the pulse current at a predetermined timing in synchronization with the pulse oscillation circuit 2, the differential operating device 33 including a differential amplifier A in which a plus-side input terminal is connected to the first hold capacitor Ch1, a minus-side input terminal is connected to the second hold capacitor Ch2, and the difference between a voltage of the first hold capacitor in response to the alternate current damped oscillation voltage at the rise time of the pulse current and a voltage of the second hold capacitor in response to the alternate current damped oscillation voltage at the fall time of the pulse current is operated, and a timing circuit 34, connected to an output terminal of the pulse oscillation circuit 2, for outputting control signals to the control terminals u, v of the first and second analog switches SW1 and SW2 for opening and closing the first analog switch SW1 and the second analog switch SW2 at respectively predetermined timings in synchronization with the pulse current output from the pulse oscillation circuit 2.

That is, the timing circuit 34 comprises a capacitor C2 in which one end is connected to the output terminal of the pulse oscillator 2 and a resistor r2 connected to the other end of the capacitor C2, an input end of a logic IC 13, and a circuit power source Q are constructed, so that the opening/closing control signal for the first analog switch SW1 is output, and also comprises a capacitor C3 in which one end is connected to an output terminal of a logic IC 14 connected to the output terminal of the pulse oscillation circuit 2 and a resistor r3 connected to the other end of the capacitor C3, an input end of a logic IC 15, and the circuit power source Q are constructed, so that the opening/closing control signal for the second analog switch SW2 is output.

In the magnetic field detecting device of the second example having the above described construction, when the pulse current shown in FIG. 13(a) is applied to the amorphous wire of the magnetic impedance element 1 placed in an arbitrary magnetic field on a predetermined period, the alternate current damped oscillation voltages Vr−Vh and −Vf−Vh rising and falling in response to rise and fall of the applied pulse current as in FIG. 13(b) are generated in the detecting coil 11.

The timing circuit 34 applies the opening/closing signals to the first analog switch SW1 and the second analog switch SW2 at predetermined timings in synchronization with the pulse current applied from the pulse oscillation circuit 2.

That is, by turning the first analog switch SW1 of the first sample-hold circuit 31 ON for a predetermined time period determined by the capacitor C2 and the resistor r2 at the rise time when the pulse current is applied to the amorphous wire 10 and then turning the switch OFF again, the alternate current damped oscillation voltage Vr−Vh at the rise time is sampled and held in the first hold capacitor Ch1 as a DC voltage.

By turning the second analog switch SW2 of the second sample-hold circuit 32 ON for a predetermined time period determined by the capacitor C3 and the resistor r3 when the pulse current falls and then turning the switch OFF again, the alternate current damped oscillation voltage −Vf−Vh at the fall time is sampled and held in the second hold capacitor Ch2 as a DC voltage.

As described above, the first and second hold capacitors Ch1 and Ch2 of the first and second sample-hold circuits 31, 32 respectively hold the magnetic signals of Vr−Vh and −Vf−Vh serving as the alternate current damped oscillation voltages at the rise time and the fall time.

The two sample-hold circuits 31, 32 are connected to two input terminals of the differential amplifier A having different polarities from each other, and the differential amplifier A performs amplification and outputs as the magnetic signal.

The alternate current damped oscillation voltage Vr−Vh at the rise time is input to the non-reverse input terminal of the differential amplifier A, and the alternate current damped oscillation voltage −Vf−Vh at the fall time is input to the reverse input terminal.

The polarity of −Vf is reversed to that of Vr. However, when the differential amplifier A performs differential amplification, the polarity is reversed and amplification is performed as shown in the following mathematical formula 6.

In addition, (Vr+Vf) in mathematical formula 6 is equal to operation of the sum of the absolute values of the alternate current damped oscillation voltage at the rise time of the pulse current and the alternate current damped oscillation voltage at the fall time of the pulse current.

$$K \times \{Vr-Vh-(-Vf-Vh)\}=K \times (Vr+Vf) \quad \text{[Formula 6]}$$

K: amplification degree of differential amplifier

The above operational result is obtained. Since the magnitude of the magnetic signals Vr and Vf are almost equal to each other, addition is performed to provide the almost double magnitude of input signal.

That is, in the magnetic field detecting device of the second example, the differential amplifier A having the function as the hysteresis component cancel means cancels the hysteresis components Vh included in the two alternate current damped oscillation voltages which are output from the detecting coil 11 at the rise time and the fall time of the pulse current and generated after applying such an excessive magnetic field that magnetic saturation occurs by the two sample-hold circuits 31, 32 respectively sample-holding the alternate current damped oscillation voltages at the rise time and the fall time of the pulse current output by the magnetic impedance element 1 and by the differential operating device 33 operating the difference between the two sample-held voltages. As a result, the offset error can be eliminated. Thus, the stability of zero point is improved, the magnetic field detection with higher accuracy is enabled, and an effect of realizing a magnetic field detecting device having such high accuracy is attained.

In the second example, the magnitude of the signals input to the differential amplifier A is increased nearly twice as much as described above to provide high sensitivity, and an effect of improving the ratio between the signal and the noise relative to the semiconductor noise of the electronic circuit serving as the processing device is attained nearly twice as much.

Further, since the magnetic signals are output from the detecting coil 11 in the second example, Vr is not superimposed on the pulse voltage Vp as in the above described first example. Thus, by using the simple sample-hold circuits 31, 32 and the differential amplifier A, the hysteresis components Vh are restrained and the stability of zero point is improved, while Vr can be extracted with nearly twice as much sensitivity, and an effect of realizing an inexpensive magnetic field detecting device having high accuracy is attained.

In the magnetic field detecting device of the second example, based on the two alternate current damped oscillation voltages output at the rise time and the fall time of the pulse current between the two electrodes of the detecting coil 11 which is wound around the amorphous wire 10, the signal processing device 3 outputs as the magnetic field signal around the amorphous wire 10. Thus, the output information of the magnetic impedance element is fully utilized. Therefore, the magnetic field detection with higher sensitivity and higher accuracy is enabled, and an effect of realizing a magnetic field detecting device as a magnetic impedance sensor having high sensitivity and high accuracy is attained.

The preferred embodiments of the present invention, as herein disclosed, are taken as some embodiments for explaining the present invention. It is to be understood that the present invention should not be restricted by these embodiments and any modifications and additions are possible so far as they are not beyond the technical idea or principle based on descriptions of the scope of the patent claims.

Figure 14:
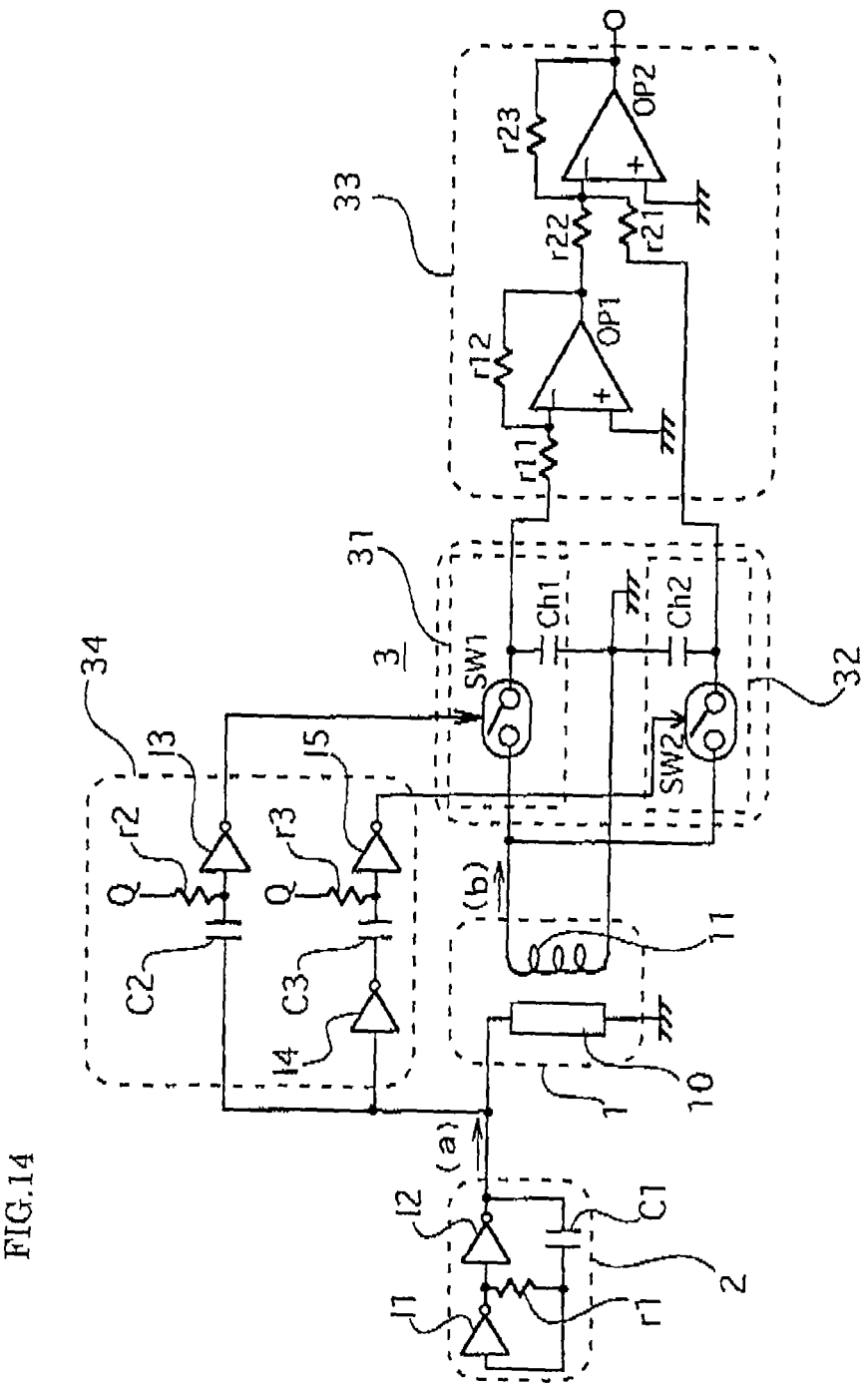
FIG. 14 is a detailed circuit diagram showing the details of a magnetic field detecting device of a first modified example of the present invention.

For example, it is possible to employ a first modified example in which the function of the hysteresis component cancel means is realized by not using the differential amplifier A shown in FIG. 12 but combining an amplifying circuit including an operational amplifier OP1, resistors r11, r12, and an operational amplifier OP2, resistors r21, r22, r23 as shown in FIG. 14 and the effects of the fifth aspect on the present invention are achieved.

That is, in FIG. 14, the magnetic signal Vr−Vh held by the sample-hold circuit 31 is connected to a polarity reversing amplifier having an amplification degree of −1 times including the resistor r11 serving as an input resistor, the resistor r12, and the operational amplifier OP1. Here, r11=r12.

Thereby, an output of the polarity reversing amplifier becomes (−1)×(Vr−Vh), and is amplified by a polarity reversing addition amplifier having an amplification degree of −K times including the resistor r22 serving as one addition input resistor connected to the output, the resistors r21 and r23, and the operational amplifier OP2, and hence output to an output terminal of the addition amplifier as −K×(−1)×(Vr−Vh) which is K×(Vr−Vh). Here, K=r23/r22=r23/r21.

The magnetic signal −Vf−Vh held by the sample-hold circuit 32 is connected to the resistor r21 serving as another addition input resistor, amplified by the polarity reversing addition amplifier having the amplification degree of −K times, and output to the output terminal as −K×(−Vf−Vh) which is K×(Vf+Vh).

Therefore, the sum made by addition of K×(Vr−Vh) and K×(Vf+Vh), which is K×(Vr−Vh)+K (Vf+Vh)=K×(Vr+Vf) is output to the output terminal of the polarity reversing addition amplifier, and the hysteresis components Vh are deleted. Thus, the function of the hysteresis component cancel means is realized as well as the above described differential amplifier, so that the effects of the present invention can be obtained.

In the above first modified example, the number of required parts such as the ICs serving as operational amplifiers and the resistors is increased. However, since normal operational amplifiers are inexpensive yet highly accurate, the operational amplifiers can be installed at lower cost than the differential amplifier (instrumentation amplifier) which is highly accurate yet expensive. Thus, there is an advantage in cost reduction.

Figure 1:
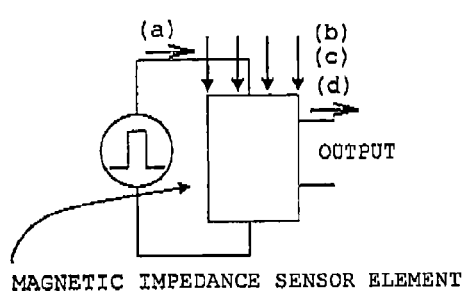
FIG. 1 is a block circuit diagram showing a main part of a conventional magnetic impedance sensor.
Figure 2:
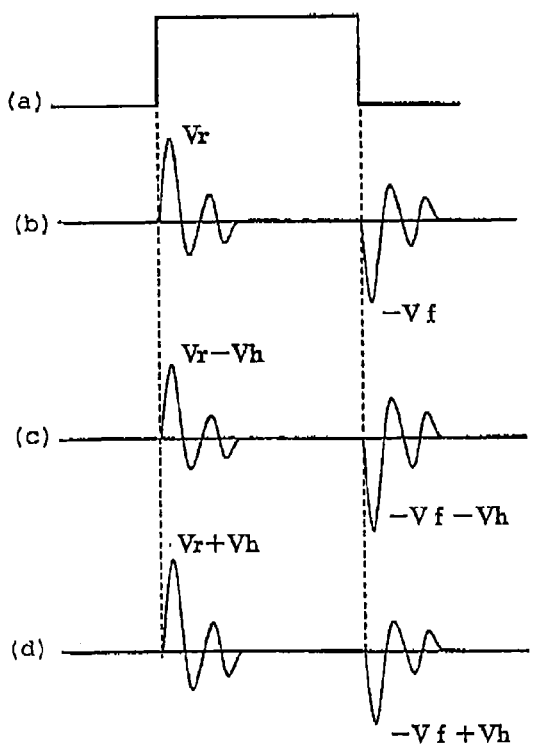
FIG. 2 is a diagram showing an applied pulse current of an amorphous wire in the conventional magnetic impedance sensor and output waveforms under different conditions.
Figure 15:
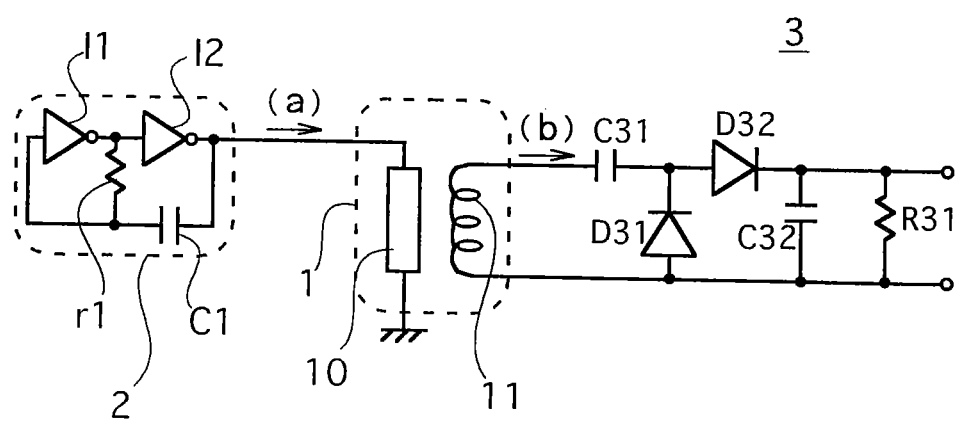
FIG. 15 is a detailed circuit diagram showing the details of a magnetic field detecting device of a second modified example of the invention.

It is possible to employ a second modified example in which by using a generally-known voltage doubler rectifying circuit as shown in FIG. 15, the functions of the external magnetic field operating means and the hysteresis component cancel means are realized by operating the peak-to-peak value between the peak value of the detected voltage Vr at the rise time of the pulse current and the peak value of the detected voltage −Vf at the fall time of the pulse current in any case of FIGS. 2(b) to 2(d) and the effects of the present invention are achieved.

Further, in the present invention, it is possible to employ a third modified example in which the same operations and effects as the above described examples are attained by taking the outputs of the detecting coil into the computer with use of the AD converter and obtaining the peak-to-peak value with use of software.

In the above described second example, the example, in which the magnetic field detection with high sensitivity and high accuracy is enabled by obtaining the difference between the alternate current damped oscillation voltage of the detecting coil at the rise time of the pulse current and the alternate current damped oscillation voltage of the detecting coil at the fall time of the pulse current with use of the differential amplifier A, and the hysteresis components Vh are canceled out, the offset error is eliminated, and improvement in the stability of zero point is achieved, is described. However, the present invention is not limited to the example. For example, it is possible to employ a fourth modified example in which the same operations and effects as the second example are achieved by reversing and converting the sign of the alternate current damped oscillation voltage of the detecting coil at the fall time of the pulse current and adding to the AC oscillation voltage of the detecting coil at the rise time of the pulse current, a fifth modified example in which only the magnetic field detection with high sensitivity is enabled by utilizing both the alternate current damped oscillation voltages at the rise time and the fall time of the pulse current in the signal processing in the signal processing device, and a sixth modified example in which the offset error is eliminated by utilizing and canceling the hysteresis components and only the stability of zero point is improved.

Further, in the above described first example, the example in which the two alternate current damped oscillation voltage waveforms output from the magnetic impedance element at the rise time and the fall time of the pulse current are utilized is described. However, the present invention is not limited to the example. It is possible to employ a seventh modified example in which the pulse voltage waveform Vp is removed from the alternate current damped oscillation voltage waveform (Vr−Vh+Vp) at the rise time of the pulse current by utilizing the pulse voltage waveform Vp serving as the alternate current damped oscillation voltage between the alternate current damped oscillation voltage waveform (Vr−Vh+Vp) at the rise time of the pulse current and the alternate current damped oscillation voltage waveform (−Vf−Vh) at the fall time in FIG. 8, and the magnetic field detection with high accuracy is performed by utilizing the pulse voltage Vp.

It is also possible to employ an eighth modified example in which the magnetic field detection with high sensitivity is performed based on both the alternate current damped oscillation voltages output between the two electrodes of the amorphous wire at the rise time and the fall time of the pulse current and the alternate current damped oscillation voltages output between the two electrodes of the detecting coil which is wound around the amorphous wire.

In the above described examples, the example in which no circuits or devices to be connected to the differential operating device 33 serving as the signal processing circuit is described as one example. However, the present invention is not limited to the examples. In a case where a comparator circuit is additionally connected to the output terminal of the differential operating device 33 and a magnetic noise which is an output signal output from the output terminal of the signal processing circuit has the magnitude greater than a reference voltage, it is possible to employ an aspect in which an information-imparting means is used to impart information while a light emitting diode connected to the output terminal of the comparator circuit emits light or a display device for always displaying detection results of foreign substances and investigation results on a display when an investigation is made or when necessary.

In the above described examples, the example in which regarding the opening and closing timings of the analog switches of the sample-hold circuits, the analog switches are closed by the two opening/closing control signals in a fixed phase relationship with the pulse current applied to the amorphous wire 10 by the single pulse oscillation circuit 2 and the timing circuit 34 is described as one examples. However, the present invention is not limited to the example. It is possible to employ such opening and closing timings that the analog switches of the sample-hold circuits are closed prior to or slightly later than the pulse current applied to the amorphous wire 10 by two pulse oscillation circuits 2 or two timing circuits.

The present invention is preferable for use of a highly accurate magnetic field detecting device in the field of physics and chemistry, weak magnetic field detection, and the like.

What is claimed is:

1. A magnetic field detecting device comprising a magnetic impedance element for outputting two alternate current damped oscillation voltages in response to the external magnetic field around an amorphous wire at a rise time and a fall time of a pulse current, in case of the pulse current is applied to said amorphous wire, and
a signal processing device for signal processing the two alternate current damped oscillation voltages output at the rise time and the fall time of the pulse current and for outputting an output signal, wherein
the output signal in response to the external magnetic field around said amorphous wire is output based on the two alternate current damped oscillation voltages output at the rise time and the fall time of the pulse current, and
said signal processing device includes a hysteresis component cancel means for canceling hysteresis components included on the two alternate current damped oscillation voltages at the rise time and the fall time of the applied pulse current, generated in case of the magnetic field being applied by the hysteresis of the magnetic variation passing through.

2. The magnetic field detecting device according to claim 1, wherein
said magnetic impedance element is constructed that the two alternate current damped oscillation voltages at the rise time and the fall time of the pulse current are output between two electrodes of said amorphous wire.

3. The magnetic field detecting device according to claim 1, wherein
said magnetic impedance element is constructed that the two alternate current damped oscillation voltages at the rise time and the fall time of the pulse current are output between two electrodes of a detecting coil wound around said amorphous wire.

4. The magnetic field detecting device according to claim 1, wherein
said signal processing device including said hysteresis component cancel means includes an external magnetic field operating means for operating the external magnetic field around said amorphous wire by obtaining a sum of absolute values of the two alternate current damped oscillation voltages including the hysteresis components at the rise time and the fall time of the pulse current.

5. The magnetic field detecting device according to claim 3, wherein
said signal processing device includes a sample hold means for sample-holding the alternate current damped oscillation voltages, and
said sample hold means comprises two sample hold circuits, having a switch means connected to said magnetic impedance element and a capacitor having one grounded end, only connected to said switch means, for sample-holding respectively the two alternate current damped oscillation voltages including the hysteresis components output from said magnetic impedance element at the rise time and the fall time of the pulse current.

6. The magnetic field detecting device according to claim 5, wherein
said hysteresis component cancel means includes an operating means for operating the difference between the two sample-held voltages of the two alternate current damped oscillation voltages including the hysteresis components output from said two sample hold circuits at the rise time and the fall time of the pulse current.

7. An improving method for improving the accuracy on the measurement for detecting a magnetic field by a magnetic impedance element for outputting the alternate current damped oscillation voltages in response to the external magnetic field around an amorphous wire, in case of the pulse current is applied to said amorphous wire,
two alternate current damped oscillation voltages are signal processed after applying the excess magnetic field to said amorphous wire of said magnetic impedance element, and
a hysteresis component generated in case of applying the excess magnetic field is cancelled by obtaining a sum of absolute values of the two alternate current damped oscillation voltages at the rise time and the fall time of the pulse current or the difference between the two voltages obtained by signal-processing two alternate current damped oscillation voltages.

* * * * *